(12) United States Patent
Zhang et al.

(10) Patent No.: US 12,310,189 B2
(45) Date of Patent: May 20, 2025

(54) DISPLAY PANEL AND MANUFACTURING METHOD THEREOF AND ELECTRONIC DEVICE

(71) Applicant: Shenzhen China Star Optoelectronics Semiconductor Display Technology Co., Ltd., Guangdong (CN)

(72) Inventors: Xin Zhang, Guangdong (CN); Juncheng Xiao, Guangdong (CN); Hongyuan Xu, Guangdong (CN); Xu Wang, Guangdong (CN); Jiayang Fei, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 982 days.

(21) Appl. No.: 17/051,453

(22) PCT Filed: May 20, 2020

(86) PCT No.: PCT/CN2020/091365
§ 371 (c)(1),
(2) Date: Oct. 29, 2020

(87) PCT Pub. No.: WO2021/217759
PCT Pub. Date: Nov. 4, 2021

(65) Prior Publication Data
US 2023/0165075 A1 May 25, 2023

(30) Foreign Application Priority Data
Apr. 30, 2020 (CN) .......................... 202010362742.4

(51) Int. Cl.
 *H10K 59/131* (2023.01)
 *G09G 3/3225* (2016.01)
 *H10K 59/12* (2023.01)

(52) U.S. Cl.
 CPC ......... *H10K 59/131* (2023.02); *G09G 3/3225* (2013.01); *H10K 59/1201* (2023.02)

(58) Field of Classification Search
 CPC ............................ H10K 59/131; H10K 59/12
 See application file for complete search history.

(56) References Cited

U.S. PATENT DOCUMENTS

2002/0135313 A1 9/2002 Koyama
2004/0195959 A1 10/2004 Park et al.
(Continued)

FOREIGN PATENT DOCUMENTS

CN 101075410 11/2007
CN 101311785 11/2008
(Continued)

*Primary Examiner* — Michele Fan (57) ABSTRACT

A display panel, a method of manufacturing thereof, and an electronic device are provided. The display panel includes: a control module connected to data lines and scan lines corresponding to a corresponding light-emitting unit, a first end of a light-emitting device connected to a first power line corresponding to the corresponding light-emitting unit, and a drive module connected to a second power line corresponding to each light-emitting unit in a corresponding to-be-driven region, the control module in the corresponding to-be-driven region, and a second end of the light-emitting device.

18 Claims, 4 Drawing Sheets

(56) References Cited

U.S. PATENT DOCUMENTS

| | | | |
|---|---|---|---|
| 2006/0139257 A1* | 6/2006 | Kwak | G09G 3/3233 |
| | | | 345/76 |
| 2008/0291223 A1 | 11/2008 | Yamazaki et al. | |
| 2012/0119667 A1* | 5/2012 | Kitazawa | G09G 3/3291 |
| | | | 315/320 |
| 2015/0015468 A1* | 1/2015 | Ko | G09G 3/3233 |
| | | | 345/82 |
| 2015/0041790 A1* | 2/2015 | Lee | H10K 59/131 |
| | | | 257/40 |
| 2017/0012093 A1 | 1/2017 | Ono et al. | |
| 2017/0309227 A1* | 10/2017 | Ebisuno | H10K 59/131 |
| 2018/0040300 A1 | 2/2018 | Chaji et al. | |
| 2019/0066565 A1 | 2/2019 | Guo | |
| 2019/0229177 A1* | 7/2019 | Kim | G09G 3/3233 |
| 2019/0325823 A1 | 10/2019 | Yang et al. | |
| 2020/0210010 A1* | 7/2020 | Kim | G09G 3/3233 |
| 2021/0118366 A1* | 4/2021 | Xuan | G09G 3/3266 |
| 2021/0335168 A1* | 10/2021 | Lee | G09G 3/006 |
| 2021/0359075 A1* | 11/2021 | Liu | H10K 59/80515 |
| 2022/0059021 A1* | 2/2022 | Xuan | G09G 3/32 |
| 2022/0309997 A1* | 9/2022 | Hu | G09G 3/3426 |

FOREIGN PATENT DOCUMENTS

| | | |
|---|---|---|
| CN | 101872587 | 10/2010 |
| CN | 102656621 | 9/2012 |
| CN | 105489169 | 4/2016 |
| CN | 107552335 | 12/2017 |
| CN | 107610658 | 1/2018 |
| CN | 209418111 | 9/2019 |
| CN | 110706653 | 1/2020 |
| CN | 108877664 | 3/2021 |

* cited by examiner

DISPLAY PANEL AND MANUFACTURING METHOD THEREOF AND ELECTRONIC DEVICE

RELATED APPLICATIONS

This application is a National Phase of PCT Patent Application No. PCT/CN2020/091365 having International filing date of May 20, 2020, which claims the benefit of priority of Chinese Patent Application No. 202010362742.4 filed on Apr. 30, 2020. The contents of the above applications are all incorporated by reference as if fully set forth herein in their entirety.

FIELD AND BACKGROUND OF THE INVENTION

The present disclosure relates to the technical field of display, and more particularly, to the technical field of a display panel, a manufacturing method thereof, and an electronic device.

A conventional organic light-emitting diode display panel comprises a plurality of light-emitting units, a plurality of scan lines, and a plurality of data lines, and further comprises a first power line and a second power line.

Figure 1:
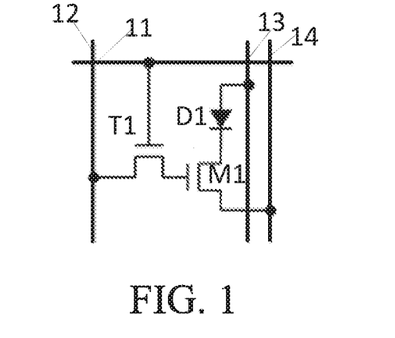
FIG. 1 is a schematic view of a conventional display panel.

Taking a single light-emitting unit as an example, as shown in FIG. 1, each light-emitting unit comprises a first transistor T1 and a second transistor M1. A gate of the first transistor T1 is connected to the scan lines 11, and a source is connected to the data lines 12. The gate of the second transistor M1 is connected to the drain of the first transistor T1, the source of the second transistor M1 is connected to the second power line 14, the source of the second transistor M1 is connected to the second end of the light-emitting device D1, and a first end of the light-emitting device D1 is connected to the first power line 13. In order to ensure the driving stability, a metal-oxide-semiconductor field-effect transistor (MOS) tube is typically used as the second transistor M1. However, due to the high cost of patch processing of the MOS tube, the manufacturing costs are relatively high.

SUMMARY OF THE INVENTION

The purpose of the present disclosure is to provide a display panel, a method of manufacturing thereof, and an electronic device, which may reduce the manufacturing cost.

To solve the technical problems described above, the present disclosure provides a display panel. The display panel comprises a plurality of data lines, a plurality of scan lines, a plurality of to-be-driven regions, and a plurality of drive modules. Each of the to-be-driven regions comprises a plurality of light-emitting units arranged in an array. Each row of the light-emitting units in the plurality of to-be-driven regions are disposed corresponding to the scan lines, and each column of the light-emitting units in the plurality of to-be-driven regions is respectively disposed corresponding to the data lines, a first power line, and a second power line. Each of the light-emitting units comprises a light-emitting device and a control module. The control module is connected to the data lines and the scan lines corresponding to each of the corresponding light-emitting units, and a first end of the light-emitting device is connected to the first power line corresponding to the corresponding light-emitting unit. Each of the drive modules is disposed corresponding to each of the to-be-driven regions. Each of the drive modules is connected to the second power line corresponding to each of the light-emitting units in each of the corresponding to-be-driven regions, each of the control modules in each of the corresponding to-be-driven regions, and a second end of the light-emitting device.

The present disclosure further provides an electronic device. The electronic device comprises the display panel described above.

The present disclosure further provides a method of manufacturing a display panel. The method of manufacturing a display panel comprises:

disposing a first metal layer on a base substrate, and patterning the first metal layer to form a first connection portion and a gate;

sequentially disposing a first insulation layer and a semiconductor layer on the first connection portion and the gate, patterning the semiconductor layer to respectively form a first sub-portion, a second sub-portion, and a third sub-portion, and forming a first via hole on the first sub-portion, wherein the first via hole penetrates the semiconductor layer and the first insulation layer;

disposing a second metal layer in the first via hole and on the first sub-portion, the second sub-portion, and the third sub-portion, and patterning the second metal layer to respectively form a second connection portion at a position corresponding to the first sub-portion, and form a source and a drain at a position corresponding to the second sub-portion, and forming a third connection portion at a position corresponding to the third sub-portion, wherein the second connection portion is connected to the first connection portion through the first via hole;

disposing a second insulation layer on the second connection portion, the third connection portion, the source, and the drain, and patterning the second insulation layer to respectively form an opening at a position corresponding to the third connection portion, and form a second via hole at a position corresponding to the second connection portion, wherein the opening is used to expose the third connection portion, and the second via hole is used to expose the second connection portion; and binding a light-emitting device on the third connection portion and connecting external signals to the second connection portion.

The display panel, a method of manufacturing thereof, and an electronic device of the present disclosure comprises a plurality of data lines, a plurality of scan lines, a plurality of to-be-driven regions, and a plurality of drive modules. Each of the to-be-driven regions comprises a plurality of light-emitting units arranged in an array. Each row of the light-emitting units in the plurality of to-be-driven regions are disposed corresponding to the scan lines, and each column of the light-emitting units in the plurality of to-be-driven regions is respectively disposed corresponding to the data lines, a first power line, and a second power line. Each of the light-emitting units comprises a light-emitting device and a control module. The control module is connected to the data lines and the scan lines corresponding to each of the corresponding light-emitting units, and a first end of the light-emitting device is connected to the first power line corresponding to the corresponding light-emitting unit. Each of the drive modules is disposed corresponding to each of the to-be-driven regions. Each of the drive modules is connected to the second power line corresponding to each of the light-emitting units in each of the corresponding to-be-driven regions, each of the control modules in each of the corresponding to-be-driven regions, and a second end of the light-emitting device. Since the plurality of light-emitting units share one drive module, patch processing cost of the MOS tube may be reduced, thereby reducing the manufacturing costs.

BRIEF DESCRIPTION OF THE SEVERAL VIEWS OF THE DRAWINGS

In order to clearly describe the technical solutions in the embodiments of the present disclosure or in the prior art, the following briefly describes the drawings used in the embodiments. The drawings described below are only part of the embodiments of the present disclosure. For a person ordinarily skilled in the art may obtain other drawings based on these drawings without creative work.

DESCRIPTION OF SPECIFIC EMBODIMENTS OF THE INVENTION

The technical solutions in the embodiments of the present disclosure will be described clearly and completely in combined with the drawings shown in the embodiments of the present disclosure. Obviously, the described embodiments are only one part of the embodiments of the present disclosure, but not all of the embodiments. Based on the embodiments of the present disclosure, all other embodiments obtained by a person skilled in the art without making creative efforts fall within the claim scope of the present disclosure.

In the present disclosure, it is appreciated that the terms "center," "longitudinal," "transverse," "length," "width," "thickness," "upper," "lower," "front," "rear," "left," "right," "vertical," "horizontal," "top," "bottom," "inner," "outer," "clockwise," "counterclockwise," and other directions or positional relationships indicated are based on the orientation or positional relationship shown in the drawings. The directions or positional relationships are only for the convenience of describing the present disclosure and simplifying the description, rather than indicating or implying that the device or element referred to must have a specific orientation, be constructed and operated in a specific orientation, and thus cannot be interpreted as a limitation of the present disclosure. Moreover, the terms "first" and "second" are only used for descriptive purposes and cannot be interpreted as indicating or implying relative significance or implicitly indicating the number of technical features indicated. Accordingly, the defined "first" and "second" features may comprise one or more of the technical features explicitly or implicitly. In the description of the present disclosure, "a plurality of" means two or more than two, unless otherwise specifically defined.

In the description of the present disclosure, it should be noted that, unless otherwise clearly specified and limited, the terms "disposed," "connected," and "connection" should be interpreted in a broad sense. For example, it may be a fixed connection, a detachable connection, or an integral connection. It may be a mechanical connection, an electrical connection, or may communicate with each other. It may be directly connected or indirectly connected through an intermediary. It may be the intercommunication between two elements or the interaction between two elements. A person ordinarily skilled in the art may understand the specific meanings of the technical terms described above in the present disclosure according to specific conditions.

In the present disclosure, unless otherwise clearly specified and limited, the first feature being "above" or "below" the second feature may comprise a condition that the first feature is direct contact with the second feature directly, or may also comprise a condition that the first feature is not direct contact with the second feature, but through an additional feature between the first feature and the second feature. Moreover, the first feature is "on," "above," and "upon" the second feature comprises a condition that the first feature is directly above and obliquely above the second feature, or simply means that the horizontal height of the first feature is higher than the horizontal height of the second feature. The first feature is "below," "under," and "beneath" the second feature comprises a condition that the first feature is directly below and obliquely below the second feature, or simply means that the horizontal height of the first feature is lower than the horizontal height of the second feature.

The following disclosure provides many different embodiments or examples for archiving different structures of the present disclosure. To simplify the disclosure of the present disclosure, the components and dispositions of specific examples are described below. Certainly, they are only examples and are not intended to limit the present disclosure. In addition, the present disclosure may repeat reference numbers and/or reference letters in different examples, and such repetition is for the purpose of simplification and clarity, and does not indicate the relationship between the various implementations and/or disposition as discussed. In addition, the present disclosure provides examples of various specific processes and materials, but a person ordinarily skilled in the art may anticipate the application of other processes and/or the use of other materials.

Figure 2:
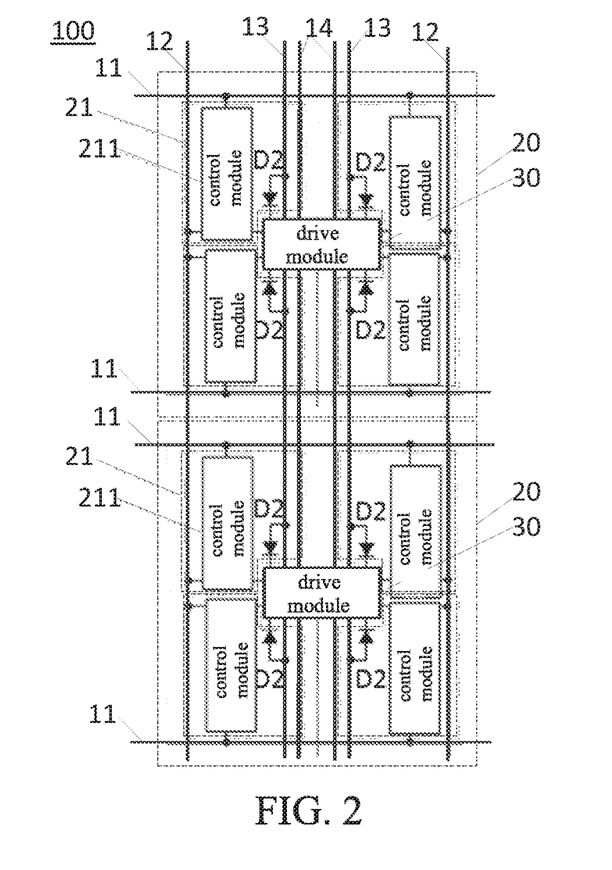
FIG. 2 is a schematic view of a display panel according to one embodiment of the present disclosure.
Figure 3:
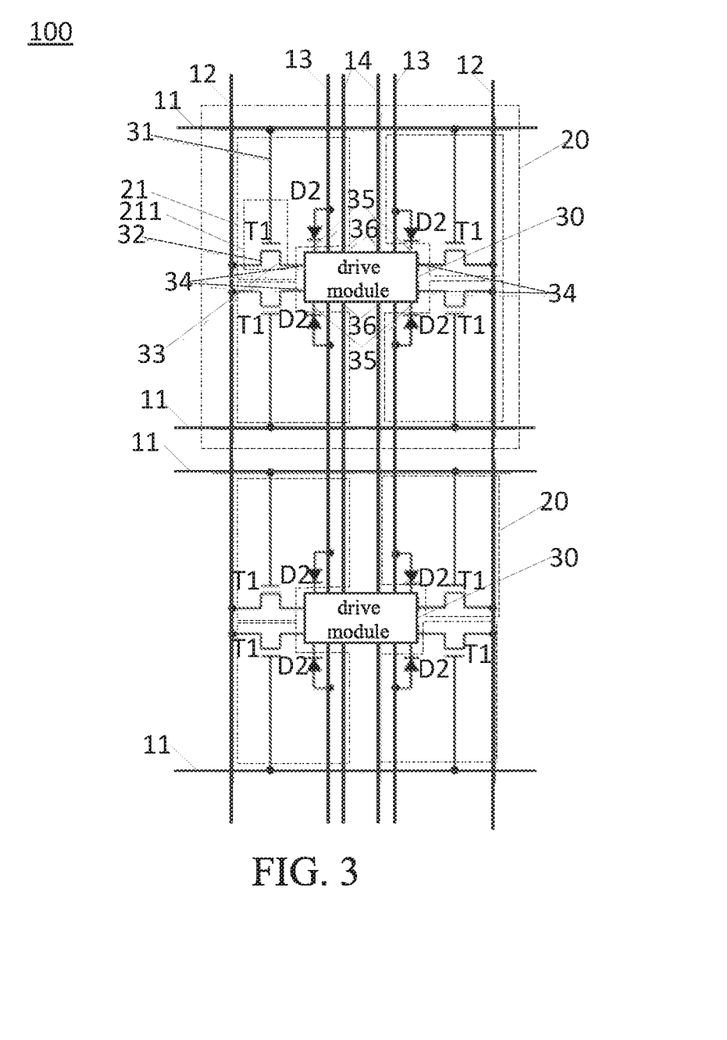
FIG. 3 is a schematic view of a display panel according to another embodiment of the present disclosure.
Figure 4:
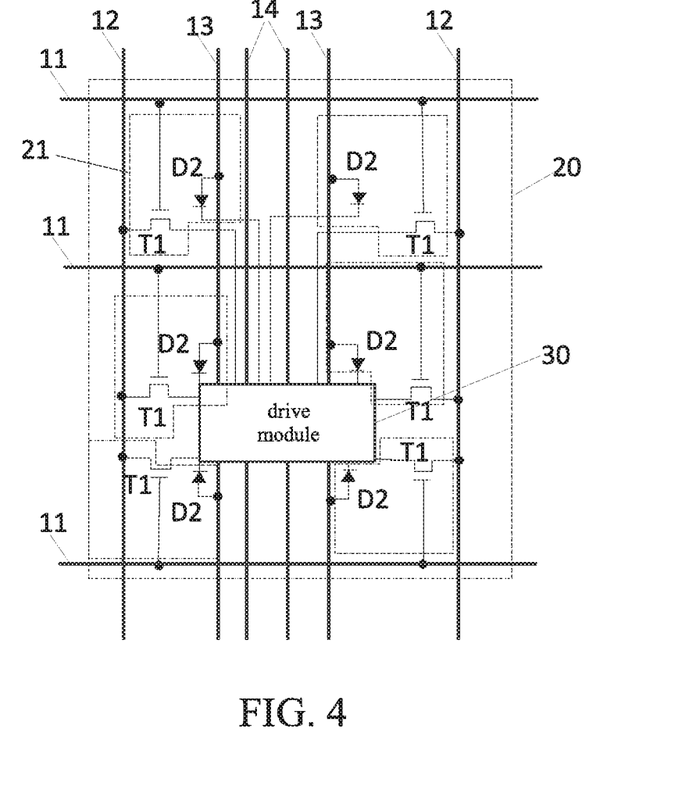
FIG. 4 is a schematic view of a display panel according to yet another embodiment of the present disclosure.

Please refer to FIG. 2 to FIG. 4. FIG. 2 is a schematic view of the display panel according to one embodiment of the present disclosure.

As shown in FIG. 2, the display panel 100 of the present embodiment comprises a plurality of scan lines 11, a plurality of data lines 12, a plurality of to-be-driven regions 20, and a plurality of drive modules 30. Each of the to-be-driven regions 20 comprises a plurality of light-emitting units 21 arranged in an array. Each row of the light-emitting units 21 in the plurality of to-be-driven regions 20 are disposed corresponding to the scan lines 11, and each column of the light-emitting units 21 in the plurality of to-be-driven regions 20 is respectively disposed corresponding to the data lines 12, a first power line 13, and a second power line 14. In one embodiment, each row of the light-emitting units in the plurality of to-be-driven regions 20 is corresponding one to one to each of the data lines 12, and each column of the light-emitting units 21 in the plurality of to-be-driven regions 20 is corresponding one to one to the data lines 12, a first power line 13, and a second power line 14. Certainly, the above corresponding relationship is not limited to this.

Each of the light-emitting units 21 comprises a light-emitting device D2 and a control module 211. The control module 211 is connected to the corresponding data lines 12 and the scan lines 11, and a first end of the light-emitting device D2 is connected to the first power line 13 corresponding to the corresponding light-emitting units 21.

Each of the drive modules 30 is disposed corresponding to each of the to-be-driven regions 20. Each of the drive modules 30 is connected to the second power line 14 corresponding to each of the light-emitting units 21 in each of the corresponding to-be-driven regions 20, each of the control modules 211 in each of the corresponding to-be-driven regions 20, and a second end of the light-emitting device D2. For example, in one embodiment, the first end of the light-emitting device D2 is an anode, and the second end of the light-emitting device D2 is a cathode. In one embodiment, in order to enhance uniformity of brightness and display effect, the corresponding to-be-driven regions 20 may be disposed in one-to-one correspondence to the drive modules 30.

FIG. 2 shows that each of the to-be-driven regions 20 comprises two rows and two columns of the light-emitting units 21. Each row of the of the light-emitting units 21 is disposed corresponding to the scan lines 11, each column of the light-emitting units 21 is disposed corresponding to the data lines 12, the first power line 13, and the second power line 14. FIG. 2 is taken as an example for explanation and cannot not limit the present disclosure.

To enhance the driving efficiency, in one embodiment, referring to FIG. 3, the control module 211 comprises a main control terminal 31, an input terminal 32, and a main output terminal 33. The main control terminal 31 is connected to the corresponding scan lines 11 (i.e., the scan lines corresponding to the corresponding light-emitting unit 21), and the input terminal 32 is connected to the corresponding data lines 12 (i.e., the data lines corresponding to the corresponding light-emitting unit 21);

Each of the drive modules 30 comprises a plurality of auxiliary control terminals 34, a plurality of auxiliary output terminals 35, and a plurality of power input terminals 36. Each of the auxiliary control terminals 34 is connected to the main output terminal 33 of each control module 211 in each of the corresponding to-be-driven regions 20. Each of the auxiliary output terminals 35 is connected to the second end of each light-emitting device D2 in each of the corresponding to-be-driven regions 20. Each of the power input terminals 36 is connected to the second power line 14 corresponding to each light-emitting device 21 in each of the corresponding to-be-driven regions 20. In one embodiment, each of the drive modules 30 is an integrated module of four MOS tubes. Certainly, the specific structure of each drive modules 30 is not limited to this.

The voltage connected to the first power line 13 is such as VDD, and the voltage connected to the second power line 14 is such as VSS. VDD is greater than VSS. Certainly, it is appreciated that each of the drive modules 30 may also comprise two power input terminals 36. Each of the auxiliary control terminals 34 is disposed corresponding to the main control terminal 31 in each of the to-be-driven regions 20. Each of the auxiliary output terminals 35 is disposed corresponding to the second end of the light-emitting device D2 in each of the to-be-driven regions 20. Each of the power input terminals 36 is disposed corresponding to the second power line 14 corresponding to each light-emitting device D2 in each of the corresponding to-be-driven regions 20. Certainly, it is appreciated that the number of the auxiliary control terminals 34, the auxiliary output terminals 35, and the power input terminals 36 is not limited to this, and the specific number thereof may be determined based on actual requirements.

In one embodiment, to further reduce the area of the light-emitting unit, and thereby further enhance the resolution, each of the to-be-driven regions 20 comprises a gap region (not shown in the figures). The gap region is formed by an interspace between two adjacent light-emitting units 21. Each of the drive modules 30 is disposed in the gap region. That is, each of the drive modules 30 is disposed corresponding to the gap region. In one embodiment, to further reduce the length of a connection line between each of the drive modules and each of the corresponding light-emitting unit 21, each of the to-be-driven regions 20 has a geometric center. For example, each of the to-be-driven regions 20 is rectangular, and the geometric center of each of the to-be-driven regions 20 overlaps with the geometric center of the rectangle. The position of each of the drive modules 30 corresponds to the position of the geometric center of each of the corresponding to-be-driven regions 20. The position of each of the drive modules 30 is disposed corresponding to the position of the geometric center of the corresponding to-be-driven regions 20, so that the voltage drop may be reduced and the uniformity of brightness may be enhanced. Certainly, the position of each of the drive modules 30 is not limited thereto.

In one embodiment, to further reduce the length of the connection line between each of the drive modules and each of the data lines as well as each of the scan lines, an orthographic projection of all of the second power line 14 corresponding to each of the to-be-driven regions 20 projected on a setting plane partially overlaps an orthographic projection of each of the drive modules 30 projected on the setting plane, and/or an orthographic projection of all of the first power line 13 corresponding to each of the to-be-driven regions 20 projected on the setting plane partially overlaps the orthographic projection of each of the drive modules 30 projected on the setting plane. Certainly, in other embodiments, the orthographic projection of one part of the second power line 14 corresponding to each of the to-be-driven regions 20 projected on the setting plane partially overlaps the orthographic projection of each of the drive modules 30 projected on the setting plane, and/or the orthographic projection of at least one part of the first power line 13 corresponding to each of the to-be-driven regions 20 projected on the setting plane partially overlaps the orthographic projection of each of the drive modules 30 projected on the setting plane. For example, in one embodiment, the second power line 14 corresponding to each of the to-be-driven regions 20 is disposed adjacently, and is located between two adjacent columns of the light-emitting units 21. The plurality of first power lines 13 corresponding to each of the to-be-driven regions 20 may also be located between two adjacent columns of the light-emitting units 21.

In one embodiment, to reduce the length of the connection line between the input terminal 32 of the control module 211 and each of the data lines 12, two adjacent data lines 12 corresponding to each of the to-be-driven regions 20 are symmetrically disposed with respect to the corresponding to-be-driven region 20. In one embodiment, two adjacent scan lines 11 may also be symmetrically disposed with respect to one of the to-be-driven regions 20.

Though FIG. 2 and FIG. 3 merely show two to-be-driven regions and two drive modules, the number of the to-be-driven regions and the drive modules of the present disclosure may be greater than or equal to two.

Despite FIG. 2 and FIG. 3 show that each of the to-be-driven regions 20 comprises two rows and two columns of the light-emitting devices 21, they cannot limit the present disclosure.

As shown in FIG. 4, in another embodiment, each of the to-be-driven regions 20 comprises three rows and two columns of the light-emitting units 21. In another embodiment, each of the to-be-driven regions 20 comprises two rows and three columns of the light-emitting units. In another embodiment, each of the to-be-driven regions 20 comprises four rows and four columns of the light-emitting units, i.e., the drive chip 30 may drive two rows and two columns of the light-emitting units or more light-emitting units. When each of the to-be-driven regions 20 comprises two rows and two columns of the light-emitting units 21, it is convenient to reduce the length of the connection line with each of the drive modules 30, thereby enhancing the uniformity of brightness.

The present disclosure also provides an electronic device, which comprises any of the display panels described above. The electronic device comprises, but is not limited to, mobile phones, notebooks, computer monitors, game consoles, televisions, display screens, wearable devices, and other home appliances or household appliances with display functions.

Figure 5:
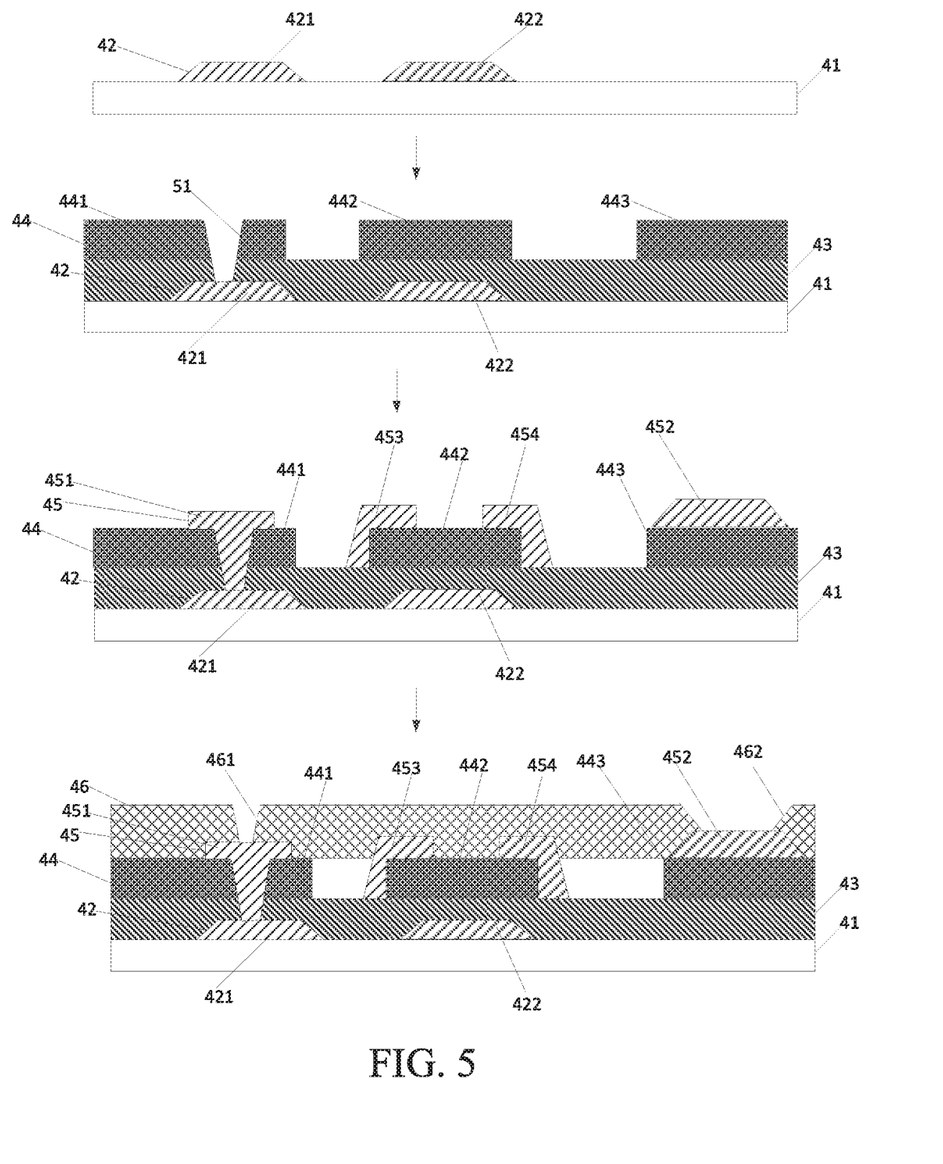
FIG. 5 is a flow chat of a manufacturing process of the display panel according to one embodiment of the present disclosure.

The present disclosure also provides a method of manufacturing a display panel, as shown in FIG. 5, which comprises steps of:

S101: disposing a first metal layer 42 on a base substrate 41, and patterning the first metal layer 42 to form a first connection portion 421 and a gate 422. For example, the base substrate 41 may be a glass substrate, and the material of the first metal layer 42 may comprise at least one of a transparent conductive material, Mo, Cu, Al, and Ti.

S102: sequentially disposing a first insulation layer 43 and a semiconductor layer 44 on the first connection portion 421 and the gate 422, patterning the semiconductor layer 44 to respectively form a first sub-portion 441, a second sub-portion 442, and a third sub-portion 4433, and forming a first via hole 51 on the first sub-portion 441. The first via hole 51 penetrates the semiconductor layer 44 and the first insulation layer 43. For example, the material of the first insulation layer 43 may include, but is not limited to, aluminum oxide, silicon nitride, silicon dioxide, and aluminum nitride. The material of the semiconductor layer 44 may be amorphous silicon or polysilicon.

S103: disposing a second metal layer 45 in the first via hole 51 and on the first sub-portion 441, the second sub-portion 442, and the third sub-portion 443, patterning the second metal layer 45 to respectively form a second connection portion 451 at a position corresponding to the first sub-portion 441, and form a source 453 and a drain 454 at a position corresponding to the second sub-portion 442, and forming a third connection portion 452 at a position corresponding to the third sub-portion 443. The second connection portion 451 is connected to the first connection portion 421 through the first via hole 51 to form a signal line, which may be used as a first power line or a second power line. For example, the material of the second metal layer 45 comprises at least one of a transparent conductive material, Mo, Cu, Al, and Ti. Preferably, the material is a metal material not easily oxidized, such as Ti.

S104: disposing a second insulation layer 46 on the second connection portion 451, the third connection portion 452, the source 453, and the drain 454, patterning the second insulation layer 46 to form a second via hole 461 at a position corresponding to the second connection portion 451, and form an opening 462 at a position corresponding to the third connection portion 452. The opening 462 is used to expose the third connection portion 452, and the second via hole 461 is used to expose the second connection portion 452. External signals are such as power supply voltage VSS or VDD. The material of the second insulation layer 46 may include, but is not limited to, aluminum oxide, silicon nitride, silicon dioxide, and aluminum nitride.

S105: binding a light-emitting device on the third connection portion 452 and connecting the external signals to the second connection portion.

The light-emitting device may comprise an organic light-emitting diode or a micro-light-emitting diode. When the light-emitting device is a micro-light-emitting diode, the display effect may be further enhanced. The second connection portion 451 is connected to an external signal, such as a power supply voltage VSS or VDD.

In one embodiment, each of the drive modules 30 is fixed to the display panel 100 by a patch. Certainly, the specific process of disposing each of the drive modules 30 is not limited.

Since a plurality of light-emitting units share one drive module, the p cost of patch processing of the MOS tube may be reduced, thereby reducing the manufacturing cost. Moreover, the area of the light-emitting unit may also be reduced, thereby enhancing the resolution.

The display panel and a method of manufacturing thereof, and an electronic device of the present disclosure comprises a plurality of data lines, a plurality of scan lines, a plurality of to-be-driven regions, and a plurality of drive modules. Each of the to-be-driven regions comprises a plurality of light-emitting units arranged in an array. Each row of the light-emitting units in the plurality of to-be-driven regions are disposed corresponding to the scan lines, and each column of the light-emitting units in the plurality of to-be-driven regions is respectively disposed corresponding to the data lines, a first power line, and a second power line. Each of the light-emitting units comprises a light-emitting device and a control module. The control module is connected to the data lines and the scan lines corresponding to each of the corresponding light-emitting units, and a first end of the light-emitting device is connected to the first power line corresponding to the corresponding light-emitting unit. Each of the drive modules is disposed corresponding to each of the to-be-driven regions. Each of the drive modules is connected to the second power line corresponding to each of the light-emitting units in each of the corresponding to-be-driven regions, each of the control modules in each of the corresponding to-be-driven regions, and a second end of the light-emitting device. Since the plurality of light-emitting units share one drive module, patch processing cost of the MOS tube may be reduced, thereby reducing the manufacturing costs.

In summary, although the present disclosure has been disclosed as above in preferred embodiments, the above-mentioned preferred embodiments are not intended to limit the present disclosure. A person ordinarily skilled in the art can make various changes and modifications without departing from the concept and scope of the present disclosure. Therefore, the claimed scope of the present disclosure based on the scope defined by the claims.

What is claimed is:
1. A display panel, comprising:
a plurality of data lines, a plurality of scan lines, a plurality of to-be-driven regions, a plurality of first power lines, a plurality of second power lines, and a plurality of drive modules,
wherein the to-be-driven regions comprise a plurality of light-emitting units arranged in an array, the light-emitting units respectively comprise a plurality of light-emitting devices and a plurality of control modules, each row of the light-emitting units is connected to one of the scan lines, each column of the light-emitting units is connected to one of the data lines, each column of the light-emitting units corresponds to each of one of the first power lines perpendicular to the scan lines and one of the second power lines perpendicular to the scan lines, respective first terminals of a first portion of the light-emitting devices respectively in each column of the light-emitting units are connected to the one of the first power lines, each of the drive modules corresponds to one or more of the to-be-driven regions, and is directly connected to a portion of the second power lines corresponding to a portion of the light-emitting units in the one or more of the to-be-driven regions, a portion of the control modules respectively in the portion of the light-emitting units, and respective second terminals of a second portion of the light-emitting devices respectively in the portion of the light-emitting units.

2. The display panel according to claim 1, wherein the control modules respectively comprise a plurality of main control terminals, a plurality of input terminals and a plurality of main output terminals, each of the main control terminals is connected to a connected one of the scan lines, and each of the input terminals is connected to a connected one of the data lines; and each of the drive modules comprises a plurality of auxiliary control terminals, a plurality of power input terminals, and a plurality of auxiliary output terminals, the auxiliary control terminals of each of the drive modules are respectively connected to the main control terminals, the power input terminals are respectively connected to the second portion of the light-emitting devices, and the auxiliary output terminals are respectively connected to the second terminals.

3. The display panel according to claim 1, wherein at least one of the to-be-driven regions comprises a gap region, and each of the drive modules is disposed in the gap region.

4. The display panel according to claim 3, wherein a position of the each of the drive modules corresponds to a position of a geometric center of the one or more of the to-be-driven regions.

5. The display panel according to claim 4, wherein respective orthographic projections of at least a part of the portion of the second power lines partially overlap an orthographic projection of the each of the drive modules; and/or respective orthographic projections of at least a part of the first power lines respectively connected to the one or more of the to-be-driven regions partially overlap the orthographic projection of the each of the drive modules.

6. The display panel according to claim 5, wherein an orthographic projection of each of the portion of the second power lines partially overlaps an orthographic projection of the each of the drive modules; and/or an orthographic projection of each of the first power lines respectively connected to the one or more of the to-be-driven regions partially overlaps the orthographic projection of the each of the drive modules.

7. The display panel according to claim 1, wherein two adjacent ones of the data lines in at least one of the to-be-driven regions are symmetrically disposed with respect to the at least one of the to-be-driven regions.

8. The display panel according to claim 1, wherein at least one of the to-be-driven regions comprises two rows and two columns of the light-emitting units.

9. The display panel according to claim 1, wherein the to-be-driven regions are corresponding one to one to the drive modules.

10. An electronic device, comprising a display panel, wherein the display panel comprises:

a plurality of data lines, a plurality of scan lines, a plurality of to-be-driven regions, a plurality of first power lines, a plurality of second power lines, and a plurality of drive modules, wherein the to-be-driven regions comprise a plurality of light-emitting units arranged in an array, the light-emitting units respectively comprise a plurality of light-emitting devices and a plurality of control modules, each row of the light-emitting units is connected to one of the scan lines, each column of the light-emitting units is connected to one of the data lines, each column of the light-emitting units corresponds to each of one of the first power lines perpendicular to the scan lines and one of the second power lines perpendicular to the scan lines, respective first terminals of a first portion of the light-emitting devices respectively in each column of the light-emitting units are connected to the one of the first power lines, each of the drive modules corresponds to one or more of the to-be-driven regions, and is directly connected to a portion of the second power lines corresponding to a portion of the light-emitting units in the one or more of the to-be-driven regions, a portion of the control modules respectively in the portion of the light-emitting units, and respective second terminals of a second portion of the light-emitting devices respectively in the portion of the light-emitting units.

11. The electronic device according to claim 10, wherein the control modules respectively comprise a plurality of main control terminals, a plurality of input terminals and a plurality of main output terminals, each of the main control terminals is connected to a connected one of the scan lines, and each of the input terminals is connected to a connected one of the data lines; and each of the drive modules comprises a plurality of auxiliary control terminals, a plurality of power input terminals, and a plurality of auxiliary output terminals, the auxiliary control terminals of each of the drive modules are respectively connected to the main control terminals, the power input terminals are respectively connected to the second portion of the light-emitting devices, and the auxiliary output terminals are respectively connected to the second terminals.

12. The electronic device according to claim 10, wherein at least one of the to-be-driven regions comprises a gap region, and each of the drive modules is disposed in the gap region.

13. The electronic device according to claim 12, wherein a position of the each of the drive modules corresponds to a position of a geometric center of the one or more of the to-be-driven regions.

14. The electronic device according to claim 13, wherein respective orthographic projections of at least a part of the portion of the second power lines partially overlap an orthographic projection of the each of the drive modules; and/or respective orthographic projections of at least a part of the first power lines respectively connected to the one or more of the to-be-driven regions partially overlap the orthographic projection of the each of the drive modules.

15. The electronic device according to claim 14, wherein an orthographic projection of each of the portion of the second power lines partially overlaps an orthographic projection of the each of the drive modules; and/or an orthographic projection of each of the first power lines respectively connected to the one or more of the to-be-driven regions partially overlaps the orthographic projection of the each of the drive modules.

16. The electronic device according to claim 10, wherein two adjacent ones of the data lines in at least one of the to-be-driven regions are symmetrically disposed with respect to the at least one of the to-be-driven regions.

17. The electronic device according to claim 10, wherein at least one of the to-be-driven regions comprises two rows and two columns of the light-emitting units.

18. The electronic device according to claim 10, wherein the to-be-driven regions are corresponding one to one to the drive modules.

* * * * *